United States Patent [19]

DeFreitas et al.

[11] 4,254,502
[45] Mar. 3, 1981

[54] DIGITAL ENCODING CIRCUITRY

[75] Inventors: Richard E. DeFreitas, Westford; John J. Blake, Pepperell, both of Mass.

[73] Assignee: DeltaLab Research, Inc., Chelmsford, Mass.

[21] Appl. No.: 71,244

[22] Filed: Aug. 30, 1979

[51] Int. Cl.³ ............... H03K 13/22; H04L 27/02
[52] U.S. Cl. ............................... 375/30; 328/151
[58] Field of Search ................. 375/25–30, 375/94, 98, 103; 328/132, 135, 151, 167; 307/352, 353, 358, 359; 329/140

[56] References Cited

U.S. PATENT DOCUMENTS

| 3,908,115 | 9/1975 | Waggener | 375/103 |
| 4,086,651 | 4/1978 | Muir et al. | 328/151 |
| 4,121,121 | 10/1978 | Gabeler | 328/151 |
| 4,158,818 | 6/1979 | Lerner | 328/167 |
| 4,190,801 | 2/1980 | DeFreitas | 325/38 B |

Primary Examiner—Donald J. Yusko

[57] ABSTRACT

In an electrical system of the type in which a digitally-encoded signal is determined at least in part by the difference between a present value of an input signal and a reconstructed signal representative of a past value of the input signal and including a filter for extracting from the digital signal information relating to the time derivative of the input signal, peak detection means for determining the peak value of the output of said filter, and a signal generating means responsive to a reference signal determined from the output of said peak detection means for generating the reconstructed signal, improved circuitry for generating the reference signal. The circuit comprises weighting means for increasing the magnitude of the input to the filter as a function of the preponderance of one or the other state in said digitally-encoded signal.

26 Claims, 1 Drawing Figure

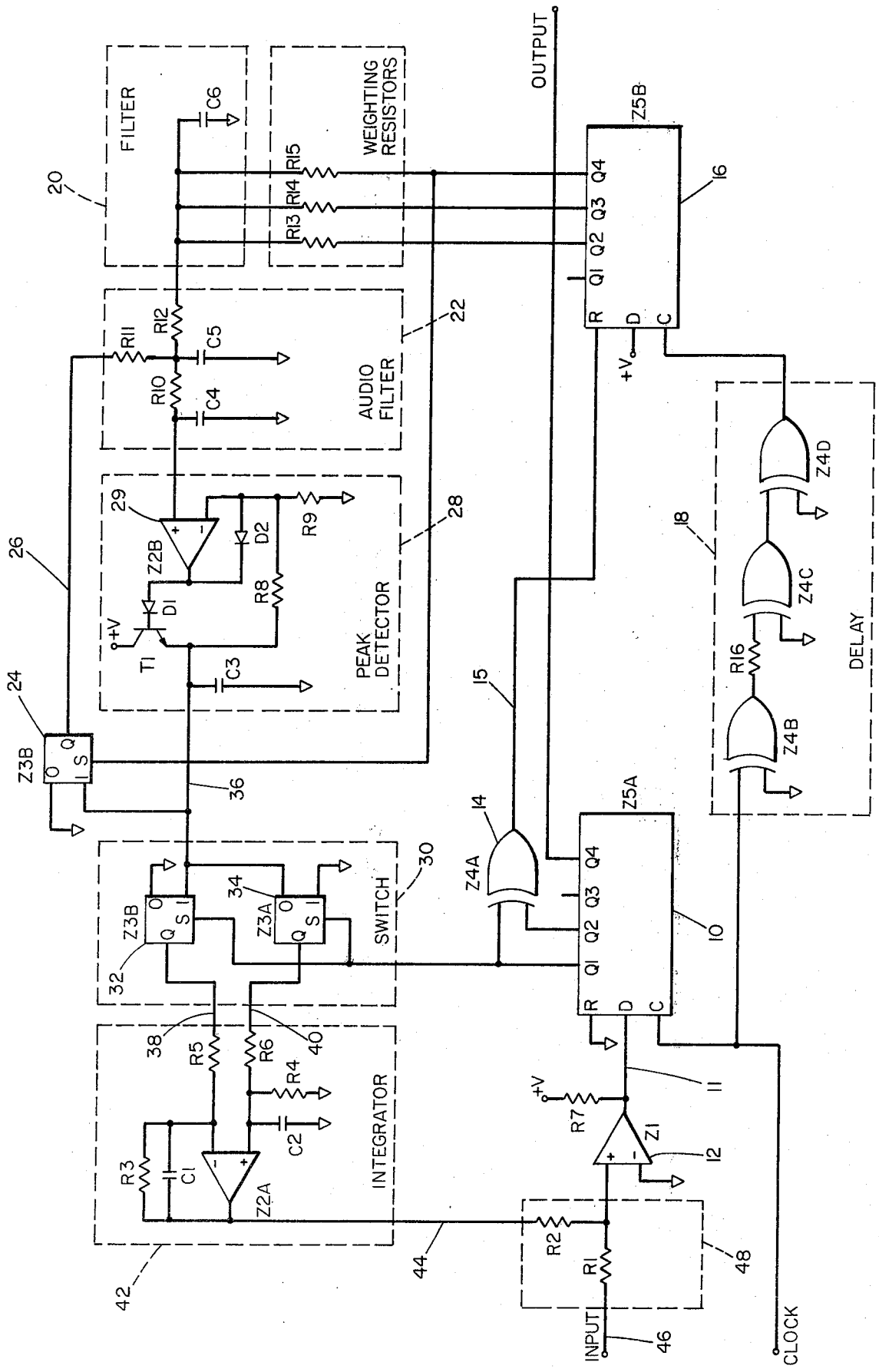

DIGITAL ENCODING CIRCUITRY

FIELD OF THE INVENTION

This invention relates to digitally encoding and decoding electrical signals.

BACKGROUND OF THE INVENTION

In delta modulating and other similar systems, the digital encoded signal stream (1's and 0's) represents the slope of each segment of the analog signal. A digital 1 means the analog slope is positive, and the decoder recontructs the analog signal by increasing it a predetermined amount. A digital 0 causes the decoder to decrease the analog signal by the same amount. Thus, the reconstructed analog signal appears as a series of positively or negatively sloped segments. The relative preponderance of 1's or 0's in the digital signal stream indicates whether the analog signal is rising, falling, or not changing.

The digital signal is encoded from an analog input by comparing, at each clock interval, the reconstructed (decoded) analog signal (the most recent output of the decoder, representative of a past value of the input to the encoder) with the present value of the input and generating a 1 if the input is less than the reconstructed signal and a 0 if the input is greater.

The major difficulty with such systems has been in choosing the amount by which to increase or decrease the reconstructed signal at each interval, i.e., the magnitude of the decoding slope. If the decoding slope chosen does not roughly match the slope of the input, there will be noticeable quantization noise or error between input and reconstructed output. If the decoding slope is held constant, the input can only accurately be encoded over a narrow range of amplitudes because too large an amplitude in the input cannot be reproduced in the decoded output. Faced with such a large input, the encoder will encode a continuous string of 1's or 0's in an unsuccessful attempt to raise or lower the output fast enough to keep up with the input. Conversely, too small an input slope is encoded as zero because the decoding slopes are so large that the reconstructed analog continuously overshoots the input, thereby producing a sawtooth of alternating 1's and 0's in the digital signal.

To overcome the limitations of using a constant decoding slope, the prior art has made the size of the decoding slope dependent on the input slope. These systems are commonly called continuously variable slope delta (CVSD) encoders, and can accomodate greater dynamic range in the input. They typically have a signal generating means (e.g., an integrator that responds to a reference signal. The reference signal is varied to change the magnitude of the decoding slope. U.S. Pat. No. 4,190,801 of DeFreitas discloses a CVSD system that varies the decoding slope (and the reference signal) in proportion to the derivative of the input or the square of the derivative. The derivative is computed by passing the digital signal through an audio filter, and the derivative squared is derived by feeding back the computed slope to the input of the audio filter. An envelope or peak detector processes the output of the filter, and the peak detector output is used as the reference for the integrator. Another copending application of DeFreitas, a divisional of Ser. No. 875,336 filed in August 1979, discloses mixing both the input derivative and derivative squared in computing the decoding slope. Both copending applications are hereby incorporated by reference.

SUMMARY OF THE INVENTION

In a first aspect, the invention features an audio filter for determining the derivative, a peak detector for determining the integrator reference signal from the filter output, and circuitry for processing (e.g., using an exclusive OR gate and a shift register) the digital signal upstream of the filter in such a manner as to make the input to the filter responsive to repetitions of two or more 0's and to repetitions of two or more 1's. In a second aspect, the invention features weighting the input to the filter so that the input is increased as a function of the preponderance of either 1's or 0's in the digital signal. In a third aspect, the invention features intermittently activating a positive-gain loop between the output of the peak detector and the input to the filter, to rapidly increase the peak detector output (the reference supplied to the integrator) while the loop is activated.

In preferred embodiments, the peak detector closely follows a rise in the output of the filter but lags behind a drop in the filter output, so as to make quantization noise less audible; weighting of the filter input is accomplished by selecting different combinations of parallel resistors arranged in a ladder; the number of repeated 1's or 0's is detected and used to select different resistors; the values of the resistors selected descend with increasing repetition length so as to increase the input current to the filter; the filter input is increased by at least a factor of two for each increase in the repetition length (e.g., no filter input for a string of two 1's or 0's, some input for a string of three, three times as much for a string of four, and seven times as much for a string of five); the positive feedback loop is activated only for a string of five 1's or 0's; a shift register is used to select resistors in the ladder; and an exclusive-OR gate works in conjunction with the shift register to make repeated 0's equivalent to repeated 1's The invention allows encoding over a greater dynamic range in the input (e.g., 100 db), can provide excellent tracking between input and output without using expensive low-tolerance components to make the encoder identical to decoder, and provides improved transient response. A difficulty with the system disclosed in the DeFreitas application is that it requires an increasing slope in the input before it can respond by increasing the decoding slope to match the input, and thus, when a transient begins with a sudden drop in amplitude and thus a high negative slope, that system missed the first half cycle of the transient. The present invention is responsive to both increasing and decreasing slopes in the input, and can thereby overcome this difficulty.

PREFERRED EMBODIMENT

The circuitry and operation of a preferred embodiment of the invention will now be described.

DRAWING

The FIGURE is a circuit schematic of an encoder embodying the invention.

CIRCUITRY

Referring to the FIGURE, a shift register 10 samples the output 11 of comparator 12 at each clock pulse. Register outputs Q1, Q2, Q3, Q4 hold the four most recent values of output 11. Outputs Q1, Q2 are connected to the inputs of exclusive-OR gate 14. Output Q3 is not used. Output Q4, which is identical to output Q1 but delayed three clock intervals, forms the encoded digital output. Output 15 of gate 14 is applied to the reset input of shift register 16, and a positive reference voltage +V is applied to input D. Delay circuit 18 consisting of the remaining three exclusive-OR gates of quad chip Z4 provides a clock delay for shift register 16. Output Q1 of register 16 is unused. Outputs Q2, Q3, Q4 are applied to weighting resistors R13, R14, R15, respectively. The current flowing through the weighting resistors is applied through filter 20, consisting of capacitor C6 and the various adjacent resistors, to audio filter 22 (25 KHz, two-pole, lowpass). Output Q4 of register 16 also controls solid-state switch 24 to selectively connect feedback loop 26 to the input of the audio filter.

Peak detector 28 processes the output of filter 22. It is a half-wave rectifier with a hold time constant in the range of about 20 to 70 ms (preferably 60 ms) and a full-scale slew time (maximum encoding slope) of 1667 microseconds. Transistor T1 at the output of operational amplifier A2 helps supply current to rapidly charge capacitor C3 to minimize the slew time.

Switch network 30 and integrator 42 process the output of the envelope detector. Two solid state switches 32, 34, which are controlled by the digital output Q1 of shift register 10, connect output 36 of the envelope detector to one of two reference inputs 38, 40 of integrator 42. The integrator produces a maximum slope or slew rate of 0.33 volts per microsecond for a 10 reference input. For simplicity the integrator has a low-end break frequency of about 500 Hz. Integrator output 44, the reconstructed analog signal, is summed with the analog input 46 at block 48 to provide the input to comparator 12.

The circuit components used are given in the following table.

Component Table

R1, R2—10K, 5%
R3, R4—301K, 1%
R5, R6—30.1K, 1%
R7—2K, 5%
R8—10K, 1%
R9—100K, 1%
R10—10K, 1%
R11—10K, 1%
R12—100K, 1%
R13—301K, 1%
R14—150K, 1%
R15—75K, 1%
R16—33K, 5%
C1, C2—1000 pF, 5%
C3—3.3 microfarad, 5%
C4, C5—220 pF, 5%
C6—4700 pF, 5%
D1—Diode 1N4148
D2—Diode 1N4148
T1—Transistor 2N2222
Z1—LM311 comparator
Z2—TL082 op. amp.
Z3—3-2IN MUX 4053 switch
Z4—4070 quad exclusive OR
Z5—4015 (CMOS dual 4-bit shift register)

OPERATION

Analog input 46 is subtracted from the reconstructed analog output 44 of integrator 42 by giving the two signals different polarities and summing them at block 48. The difference signal is presented to comparator 12, which produces an output signal 11 that alternates between zero and +V volts depending on the polarity of the difference. Shift register 10 converts output 11 to a synchronized digital signal of 1's and 0's at its outputs Q1, Q2, Q3, Q4. Output Q1 has the most current digital value, and output Q2 the previous value.

Integrator 42 is controlled by switches 32, 34 in response to output Q1. If Q1 is a 1, switch 32 connects reference signal 36 (the output of envelope detector 28) to integrator input 38, and the integrator decreases the reconstructed output 44. If Q1 is a 0, switch 34 connects the reference signal to input 40, and the integrator increases the reconstructed output. The amount by which the reconstructed output is increased or decreased, i.e., the decoding slope, is set by the amplitude of reference signal 36.

The reference signal is determined by the loop including gate 14, register 16, the weighting resistors, filter 20, audio filter 22, and envelope detector 28. The reference, and thus the decoding slope, is increased whenever the digital signal exhibits repeated 1's or 0's, as this is an indication that the slope is inadequate to follow the input.

Exclusive-OR gate 14 senses whether there is repetition in the digital signal. It generates a 1 at its output only if the present and previous digital values are different (i.e., 1, 0 or 0, 1). Thus if the digital signal becomes a steady stream of 1's or a steady stream of 0's, output 15 of gate 14 is zero.

Shift register 16 produces outputs that indicate the length of a repetition of 1's or 0's in the digital signal. Exclusive-OR output 15 controls the reset input R, and a +V reference voltage is always applied to input D. Thus outputs Q1, Q2, Q3, Q4 will remain zero if output 15 continues to exhibit 1's, meaning no repetition in the digital signal. On the other hand, if output 15 goes to zero, meaning a string of two 1's or two 0's in the digital signal, the register shifts a 1 onto output Q1. And if output 15 remains zero for two clock intervals, meaning a string of three 1's or 0's, the register shifts a 1 onto both Q1 and Q2. Similarly, a string of four 1's or 0's produces 1's on outputs Q1, Q2, Q3, and five successive 1's or 0's produces 1's on all four register outputs.

The register outputs Q2, Q3, Q4 directly supply current via weighting resistors R13, R14, R15 and filter 20 to audio filter 22. Thus the current supplied to the audio filter, and therefore the size of reference signal 36, is increased as a function of the length of repetition in the digital signal. Output Q1 is not used because it represents only a string of two 1's or two 0's, and thus does not call for an increase in the reference signal. Weighting resistors R13, R14, R15 have values (301K, 150K, 75K) that descend in a geometric progression, each being one-half the value of the previous resistor. This causes the filter current to increase by a factor of more than two for each increase in the repetition length. For example, a string of three 1's generates current through only resistor R13 (301K), but a string of four 1's generates current through both R13 and R14, thereby raising the current by a factor of three.

When the repetition length reaches five 1's or 0's, an infrequent occurence only likely to occur with sharp transients (e.g., a cymbal clash in music), activation of Q4 raises the current supplied by the weighting resistors to seven times its previous value. But in addition, as a kind of last resort mechanism for increasing the reference, output Q4 also switches into play feedback loop 26 to feed back the reference signal to filter 22. As the gain of the feedback loop is about 1.1 (set by detector 28), the loop is slightly unstable and thus tends to increase the reference signal as fast as capacitors C4, C5 of the filter and C3 of the detector can be charged. In ordinary use, however, the loop would only remain activated a very few clock intervals because once the reference signal was increased to a level at which the reconstructed output 44 overtakes the input, the digital signal would return to 0 for an interval, and the loop would switch off, as would all the current supplied the filter through the weighting network.

Filter 20 smooths the sharp transitions in current supplied by the weighting resistors, and audio filter 22, with a cutoff frequency of 25 KHz at the upper end of the audio spectrum, performs an averaging of the digital signal and thereby computes an approximation of the derivative of the input 46. When repetitions in the digital signal are no longer than two, the filter sees no current, and its output is zero. When repetitions are longer, current flows through the weighting resistors, and the filter output climbs to a positive voltage.

Peak detector 28 computes the peak value of the output of filter 22. When the filter output rises, transistor T1 and amplifier A2 rapidly charge capacitor C3 so that the reference signal 36 closely follows the rise. Thus the encoder can accurately encode a sudden rise in the input (and in the input slope). When the filter output falls, on the other hand, reference signal 36 decays slowly, limited by the discharge rate of capacitor C3. This has the effect of maintaining the decoding slope at a high level for a short period (60 msec time constant) even though a smaller decoding slope would more accurately encode the input signal. Although this produces more quantization noise than would result without the slow decay, the slow change in the amplitude of the quantization noise makes the noise less audible to the human ear.

A standby reference input is not required in the peak detector because, unlike the system disclosed in the copending application of DeFreitas, Ser. No. 875,336, a condition of all 0's in the digital signal will produce (via gate 14 and registers 10, 16) an input to filter 22 and peak detector 28. The absence of the standby reference permits accurate encoding of very small input slopes, thereby extending the dynamic range of the system to about 100 db when the clock frequency is in the range of 15 to 25 times the highest frequency of interest in the input. The clock frequency should be at least 10 times the highest input frequency (about 250 KHz).

A decoder emboding the invention would employ similar circuitry to that shown for the encoder. Input D of shift register 10 would be the input for the digital signal, and output 44 of the integrator would be the reconstructed analog output. Summing block 48 and comparator 12 would be ommitted.

Other embodiments of the invention are within the following claims. For example, while the preferred embodiment of the invention relates to a delta modulation system, the invention may be used in other encoding and decoding systems, including voltage to frequency modulators, pulse width modulators, delta sigma modulators, and pulse code modulation.

What is claimed is:

1. In an electrical system of the type in which a digitally-encoded signal with high and low states is determined at least in part by the difference between a present value of an input signal and a reconstructed signal representative of a past value of said input signal and including signal generating means responsive to a reference signal determined from the output of said peak detection means for generating said reconstructed signal, improved circuitry for generating said reconstructed signal, comprising a filter for extracting from the digital signal information relating to the time derivative of said input signal, peak detection means for determining the peak value of the output of said filter, and means upstream of said filter for responding to a repetition of two or more low states and to a repetition of two or more high states in said digital signal, said filter responding to the output of said upstream means, thereby making said filter and said signal generating means sensitive to repetition of both states of said digital signal.

2. The electrical system of claim 1 further comprising weighting means for increasing the magnitude of the input of said filter as a function of the preponderance of one or the other of said states.

3. The electrical system of claim 1 wherein said means upstream of said filter comprises logic means for detecting whether the past and present digital states are the same and if so generating a high digital state as an output to be supplied the filter and if not generating a low digital state.

4. In an electrical system of the type in which a digitally-encoded signal with high and low states is determined at least in part by the difference between a present value of an input signal and a reconstructed signal representative of a past value of said input signal and including signal generating means responsive to a reference signal determined from the output of said peak detection means for generating said reconstructed signal, improved circuitry for generating said reference signal, comprising a filter for extracting from the digital signal information relating to the time derivative of said input signal, peak detection means for determining the peak value of the output of said filter, and weighting means for increasing the magnitude of the input to said filter as a function of the preponderance of one or the other of said states.

5. In an electrical system of the type in which a digitally-encoded signal with high and low states is determined at least in part by the difference between a present value of an input signal and a reconstructed signal representative of a past value of said input signal and including signal generating means responsive to a reference signal determined from the output of said peak detection means for generating said reconstructed signal, improved circuitry for generating said reference signal, comprising a filter for extracting from the digital signal information relating to the time derivative of said input signal, peak detection means for determining the peak value of the output of said filter, and means for intermittently activating a positive-gain loop between the output of said peak detection means and the input to said filter to make the input to said filter dependent on the output of said peak detection means, to thereby rapidly increase said reference signal while said loop is activated.

6. The electrical system of claim 5 further comprising weighting means for increasing the magnitude of the input to said filter as a function of the preponderance of one or the other of said states.

7. The electrical system of claim 1, 4, or 5 wherein said peak detection means includes means for closely following a rise in the output of said filter and for lagging behind a drop in the output of said filter, the lag time constant being of at least the period of the lowest frequency of said input signal.

8. The electrical system of claim 4 or 6 wherein said weighting means comprises a resistor ladder and means for selecting different resistors on said ladder in relation to said preponderance of a state in said digital signal.

9. The electrical system of claim 8 wherein said means for selecting different resistors includes repetition length detecting means for detecting the length of a repetition of the same state in said digital signal and for activating a different one of said resistors with each increase in the length of said repetition.

10. The electrical system of claim 4 or 6 wherein said weighting means includes repetition length detecting means for detecting the length of a repetition of the same state in said digital signal and means for increasing the input to said filter by progressively larger amounts for each increase in the length of said repetition in the digital signal.

11. The electrical system of claim 10 wherein said inputs to said filter at least double for each increase in the length of said repetition.

12. The electrical system of claim 10 wherein said repetition detecting means comprises means for detecting repetitions of three and of four clock intervals in length and said weighting means comprises means for supplying a first amplitude input to said filter for a repetition of three intervals and a second amplitude input to said filter for a repetition of four intervals, said second amplitude being at least double said first amplitude.

13. The electrical system of claim 12 wherein said repetition detecting means comprises means for detecting a repetition of five clock intervals and said weighting means further comprises means for supplying a third amplitude input to said filter for repetitions of five intervals, said third amplitude being at least double said second amplitude.

14. The electrical system of claim 13 wherein said second amplitude is three times said first and said third amplitude is seven times said first.

15. The electrical system of claim 5 wherein the gain of said loop is greater than one.

16. The electrical system of claim 13 wherein said means for detecting a repetition of five clock intervals in length includes means for activating a positive-gain loop between the output of said peak detection means and the input to said filter to make the input to said filter dependant on the output of said peak detection means, to thereby rapidly increase said reference signal while said repetition of five intervals persists.

17. The electrical system of claim 10 wherein said weighting means comprises a plurality of parallel resistors connected on one end to the input to said filter and said repetition detecting means comprises means for providing a plurality of outputs connected to said resistors, said outputs being progressively activated with increases in the length of said repetition, whereby the amount by which the input to said filter is increased for each increase in the repetition length can be established by setting the values of said resistors.

18. The electrical system of claim 17 wherein said resistors decrease in value for longer repetitions.

19. The electrical system of claim 18 wherein said repetition detecting means comprises a shift register for counting the length of said repetition and having a plurality of outputs each corresponding to a certain repetition length.

20. The electrical system of claim 19 wherein said repetition detecting means further comprises logic means for detecting whether the past and present digital states are the same and said shift register is responsive to the output of said logic means such that at each interval when said logic means detects no change in the state of said digital signal said shift register increases its count of the length of said repetition.

21. The electrical system of claim 20 wherein said logic means includes a second shift register and an exclusive-OR gate, said register being responsive to the output of a comparator that detects the difference between said input and said reconstructed analog signal and being adapted to generate said digital signal and store past values of said digital signal on a plurality of outputs and said gate being connected to two outputs of said register that carry the present and past values of said digital signal.

22. The electrical system of claim 1, 4, or 5 wherein said signal generating means comprises first means for increasing said reconstructed analog signal, second means for decreasing said reconstructed signal, and first and second switch means for switching said reference signal to said first and second means, said switch means being controlled by said digital signal such that said reference is applied to one of said first and second means if said digital signal is low and to the other of said means if said signal is high.

23. The electrical system of claim 1, 4 or 5 wherein said signal generating means comprises an integrator.

24. The system of claim 5 wherein said means for intermittently activating said loop includes means responsive to the preponderance of one or the other of said states for activating said loop when said preponderance exceeds a selected threshold.

25. The system of claim 24 wherein said means responsive to the preponderance includes means responsive to the length of a repetition of one or the other of said states and said selected threshold is a selected repetition length.

26. The system of claim 25 wherein said repetition length consists of repetition of five of the same said states.

* * * * *